United States Patent
Hou et al.

(10) Patent No.: US 9,578,778 B2
(45) Date of Patent: Feb. 21, 2017

(54) APPARATUS FOR RECEIVING A PLURALITY OF MEMORY CARDS

(75) Inventors: Bocheng Hou, Beijing (CN); Shixiang Wu, Beijing (CN); Henrik Franck, Beijing (CN); Morten Rolighed Christensen, Beijing (CN); Han Tao, Beijing (CN); Yuk Fung Chan, Beijing (CN)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 14/394,810

(22) PCT Filed: May 4, 2012

(86) PCT No.: PCT/CN2012/075079
§ 371 (c)(1),
(2), (4) Date: Oct. 16, 2014

(87) PCT Pub. No.: WO2013/163811
PCT Pub. Date: Nov. 7, 2013

(65) Prior Publication Data
US 2015/0098194 A1 Apr. 9, 2015

(51) Int. Cl.
*H05K 1/14* (2006.01)
*H05K 7/14* (2006.01)
(Continued)

(52) U.S. Cl.
CPC ........... *H05K 7/1424* (2013.01); *G06K 7/0021* (2013.01); *G06K 7/0073* (2013.01); *H04B 1/3816* (2013.01); *H04M 2250/14* (2013.01)

(58) Field of Classification Search
USPC ....... 361/737, 727–730, 748, 807, 809, 810; 439/160, 188, 325, 630, 625, 626, 629
See application file for complete search history.

(56) References Cited

U.S. PATENT DOCUMENTS 5,316,488 A * 5/1994 Gardner ................. G06K 13/08
439/541.5
5,324,204 A * 6/1994 Lwee ...................... G06F 1/184
361/679.32
(Continued)

FOREIGN PATENT DOCUMENTS

CN 1402497 A 3/2003
CN 201100953 Y 8/2008
(Continued)

OTHER PUBLICATIONS

"SIM Card Connectors"; Retrieved from the Internet Mar. 2012; http://www.globalconnectortechnology.com/sim-connectors/sim-connector.aspx; whole document (2 pages).

*Primary Examiner* — Hung S Bui
(74) *Attorney, Agent, or Firm* — Harrington & Smith

(57) ABSTRACT

An apparatus and corresponding memory card holder wherein the apparatus includes: a casing configured to enable a plurality of memory cards to be removably inserted into the casing; contact pads located within the casing configured to enable an electrical connection to be established between the contact pads and at least one memory card when the plurality of memory cards are inserted within the casing; and at least one mounting portion configured to enable the apparatus to be mounted on a circuit board such that a first portion of the apparatus is positioned above the circuit board and a second portion of the apparatus is positioned below the circuit board.

22 Claims, 5 Drawing Sheets

(51) Int. Cl.
*G06K 7/00* (2006.01)
*H04B 1/3816* (2015.01)

(56) References Cited

U.S. PATENT DOCUMENTS

| | | | | | |
|---|---|---|---|---|---|
| 5,400,216 | A | * | 3/1995 | Tsai | G06F 1/1632 361/679.32 |
| 5,679,007 | A | * | 10/1997 | Potdevin | G06K 7/0021 439/76.1 |
| 5,816,826 | A | * | 10/1998 | Colemen | H01R 12/721 439/64 |
| 6,129,562 | A | * | 10/2000 | Hong | H01R 12/721 439/607.32 |
| 6,663,007 | B1 | * | 12/2003 | Sun | G06K 7/0043 235/441 |
| 7,713,091 | B2 | * | 5/2010 | Chen | H01R 31/06 439/630 |
| 9,025,335 | B2 | * | 5/2015 | Heiskanen | G06K 7/0021 361/727 |
| 2003/0207600 | A1 | * | 11/2003 | Ho | H01R 12/725 439/79 |
| 2003/0232613 | A1 | | 12/2003 | Kerth | |

FOREIGN PATENT DOCUMENTS

| | | |
|---|---|---|
| CN | 201112622 Y | 9/2008 |
| CN | 201130735 Y | 10/2008 |
| CN | 201266959 Y | 7/2009 |
| CN | 201813043 U | 4/2011 |
| CN | 202004187 U | 10/2011 |
| CN | 202067932 U | 12/2011 |
| CN | 202142695 U | 2/2012 |
| CN | 1402497 A | 3/2013 |
| EP | 1039406 A2 | 9/2000 |
| EP | 2128994 A2 | 12/2009 |
| JP | H07-302645 A | 11/1995 |

\* cited by examiner

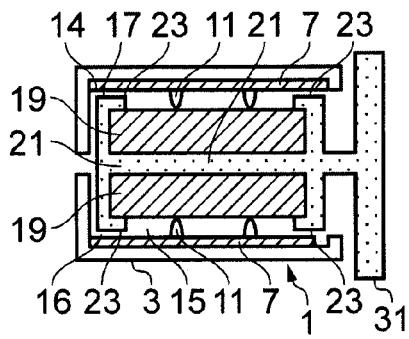
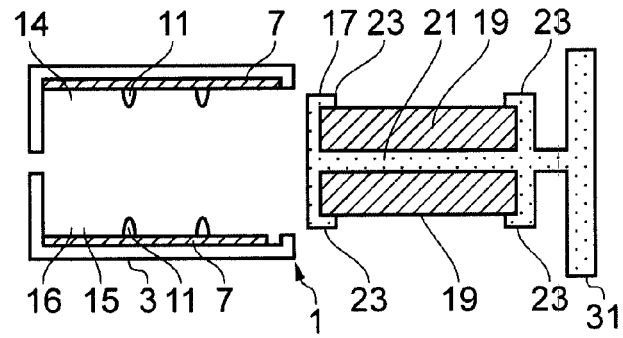
FIG. 4A  FIG. 4B
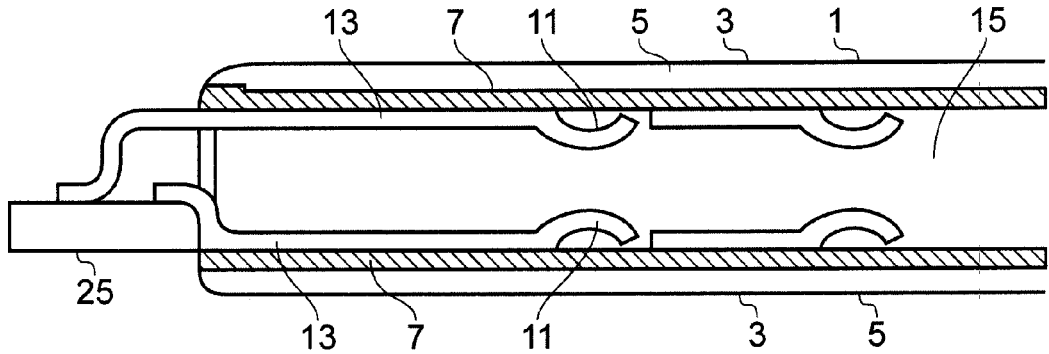
FIG. 4
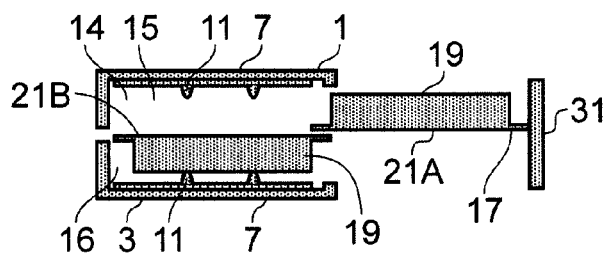
FIG. 5A
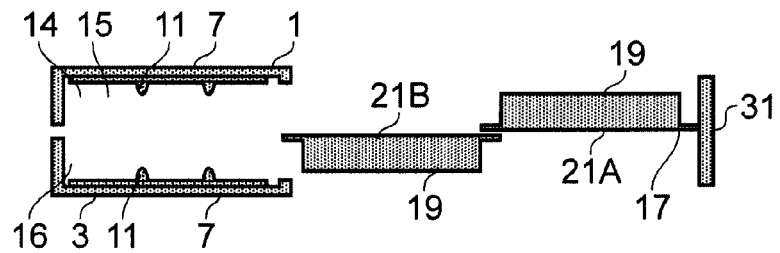
FIG. 5B

APPARATUS FOR RECEIVING A PLURALITY OF MEMORY CARDS

TECHNOLOGICAL FIELD

Embodiments of the present disclosure relate to an apparatus for receiving a plurality of memory cards. In particular, they relate to an apparatus for receiving a plurality of memory cards and enabling an electrical connection to be established between the apparatus and the plurality of memory cards.

BACKGROUND

Devices which use memory cards such as SIM (subscriber identity module) cards are known. Memory cards such as SIM cards may store information such as identification information relating to a user, location information, phone number, network authorization information, personal security keys, contact lists or stored text messages or any other type of information. A SIM card may be inserted into a device to enable the information stored on the SIM card to be used to enable the device to communicate within a network such as a wireless communications network.

A user may own more than one memory card such as a SIM card. This may enable the same device to be used with different SIM cards. Each card may be associated with a different user or a different account and the user may be able to choose which card to use. For example they may have a first SIM card which enables a device to be used for work purposes and a second SIM card which enables the device to be used for social purposes. It may be useful to enable the same device to hold both of the SIM cards simultaneously. This may to make it easier for the user to switch between the two cards.

BRIEF SUMMARY

According to some, but not necessarily all, embodiments of the disclosure there may be provided an apparatus comprising: a casing configured to enable a plurality of memory cards to be removably inserted into the casing; contact pads located within the casing configured to enable an electrical connection to be established between the contact pads and at least one memory card when the plurality of memory cards are inserted within the casing; and at least one mounting portion configured to enable the apparatus to be mounted on a circuit board such that a first portion of the apparatus is positioned above the circuit board and a second portion of the apparatus is positioned below the circuit board.

In some embodiments the at least one mounting portion may comprise a support on at least one side of the casing. In some embodiments an upper portion of the casing may have a larger width than a lower portion of the casing to form the support. In some embodiments the support may comprise a projection from the at least one side of the casing.

In some embodiments the casing may be configured so as to receive the plurality of memory cards in a stacked configuration.

In some embodiments the casing may be configured to receive a memory card holder wherein the memory card holder is configured to hold the plurality of memory cards.

In some embodiments the contact pads may comprise a first set of contact pads and a second set of contact pads wherein the first set of contact pads may be configured to enable an electrical connection to be established between the first set of contact pads and a first memory card and the second set of contact pads may be configured to enable an electrical connection to be established between the second set of contact pads and a second memory card.

In some embodiments the first set of contact pads may be located on an opposing side of the casing to the second set of contact pads.

In some embodiments the apparatus may comprise a spring mechanism which may be configured to enable the memory cards to be ejected from the casing.

In some embodiments the casing may comprise a metal layer.

In some embodiments the casing may comprise an insulating layer.

In some embodiments the contact pads may be mounted on the insulating layer.

According to some, but not necessarily all, embodiments of the disclosure there may also be provided a memory card holder comprising at least one flat substrate configured to hold a plurality of memory cards wherein the memory card holder is configured to be removably inserted into the casing of an apparatus as claimed in claim 1.

In some embodiments the memory card holder may be configured to hold the plurality of memory cards in a stacked configuration.

In some embodiments the at least one substrate may be configured to hold a first memory card and a second memory card such that contact points of the first and second memory cards face towards opposite directions.

In some embodiments the memory card holder may comprise a first substrate and a second substrate wherein the first substrate is configured to hold a first memory card and the second substrate is configured to hold a second memory card and the first and second substrates are configured to be moved with respect to each other.

In some embodiments the first and second substrates may be slid relative to each other in a direction parallel with a plane of the substrates.

According to some, but not necessarily all, embodiments of the disclosure there may also be provided a memory card reader comprising an apparatus as claimed described above and a memory card holder as described above.

According to some, but not necessarily all, embodiments of the disclosure there may also be provided a memory card holder configured to hold a plurality of memory cards comprising a first substrate and a second substrate wherein the first substrate is configured to hold a first memory card and the second substrate is configured to hold a second memory card and the first and second substrates are configured to be moved with respect to each other.

In some embodiments the memory card holder may be configured to hold the plurality of memory cards in a stacked configuration.

The apparatus may be for establishing an electrical connection with a plurality of memory cards.

BRIEF DESCRIPTION

For a better understanding of various examples of embodiments of the present disclosure reference will now be made by way of example only to the accompanying drawings in which:

FIGS. 4A to 4C illustrate a side view of an apparatus according to an examplary embodiment of the disclosure;

FIGS. 5A and 5B illustrate a side view of an apparatus according to another examplary embodiment of the disclosure.

DETAILED DESCRIPTION

Figure 1A:
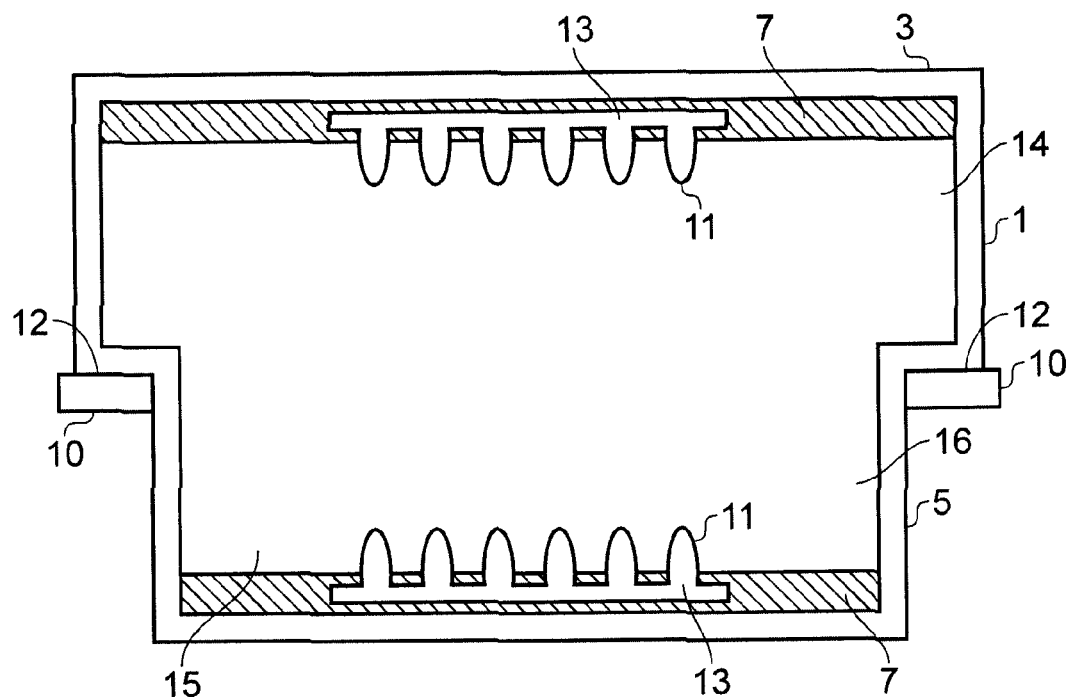
FIGS. 1A and 1B illustrate an apparatus according to a first exemplary embodiment of the disclosure.

The Figures illustrate an apparatus 1 comprising: a casing 3 configured to enable a plurality of memory cards 19 to be removably inserted into the casing 3; contact pads 11 located within the casing 3 configured to enable an electrical connection to be established between the contact pads 11 and at least one memory card 19 when the plurality of memory cards 19 are inserted within the casing 3; and at least one mounting portion 12 configured to enable the apparatus 1 to be mounted on a circuit board 25 such that a first portion 14 of the apparatus 1 is positioned above the circuit board 25 and a second portion 16 of the apparatus 1 is positioned below the circuit board 25.

Figure 1B:
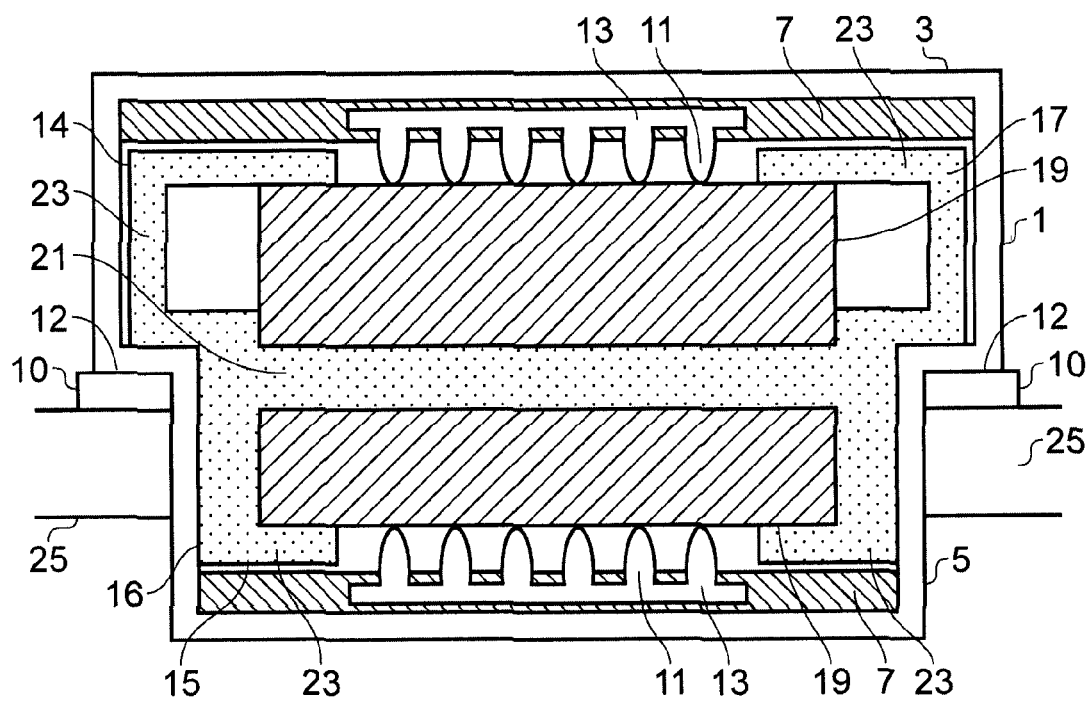

FIGS. 1A and 1B illustrate an apparatus 1 according to a first examplary embodiment of the disclosure. FIG. 1A illustrates a cross section of the apparatus 1. FIG. 1B illustrates a cross section of the apparatus 1 mounted within a circuit board 26 and with two memory cards 19 inserted within the apparatus 1. The apparatus 1 and the memory card holder 17 may be coupled together to form a memory card reader. The memory card reader may be configured to read information stored on the memory card 19 and provide this to the electronic device.

The examplary apparatus 1 illustrated in FIG. 1A comprises a casing 3. The casing 3 comprises a metal layer 5, at least one insulating layer 7, at least one set of contact pads 11 and a mounting portion 12.

The casing 3 forms a cavity 15. The casing 3 may surround the cavity 15 so that the casing 3 defines the edges of the cavity 15. As the apparatus 1 is illustrated in cross section in FIG. 1 only the sides of the casing 9 are illustrated. It is to be appreciated that the casing 3 may extend into the page.

The casing 3 may have at least one open end which enables a plurality of memory cards 19 to be removably inserted within the cavity 15 of the casing 3. The memory cards 19 are not illustrated in FIG. 1A.

The cavity 15 may be configured to receive the plurality of memory cards 19. The cavity 15 may have a size and shape such that the plurality of memory cards 19 may fit tightly within the cavity 15. The plurality of memory cards 19 may fit tightly within the cavity 15 so that there is no gap or very little gap between the edges of the memory cards 19 and the memory card holder 17 and the edge of the cavity 15.

In the examplary embodiment illustrated in FIGS. 1A and 1B the casing 3 comprises a metal layer 5. The metal layer 5 extends around the edge of the apparatus 1 and may form an outer surface of the apparatus 1. The metal layer 5 may also form a support for the contact pads 11.

The shape of the metal layer 5 may define the cross sectional shape of the apparatus 1. In the examplary embodiment of FIGS. 1A and 1B the apparatus 1 comprises an upper portion 14 and a lower portion 16. In the examplary embodiment illustrated in FIG. 1 the upper portion 14 has a larger width than the lower portion 16. This creates a T-shaped cross section of the casing 3. The change in width between the upper portion 14 and the lower portion 16 creates a projection out of the side of the casing 3. The projection forms a support for the mounting portion 12. In the examplary embodiment illustrated in FIGS. 1A and 1B the mounting portion 12 is provided at approximately the mid-height of the casing 3.

In the examplary embodiment of FIGS. 1A and 1B the mounting portion 12 also comprises a securing portion 10. The securing portion 10 is provided on the underside of the support projection. The securing portion 10 may comprise any means which may enable the apparatus 1 to be secured to a circuit board 25 such as a printed wiring board. The securing portion 10 may comprise a material which enables the apparatus 1 to be secured to the circuit board 25 for example by welding or soldering or an adhesive.

In the examplary embodiments of FIGS. 1A and 1B a mounting portion 12 and a securing portion 10 are provided on either side of the casing 3. The two mounting portions 12 may be provided at the same height so that the apparatus 1 can be mounted with the upper and lower surfaces of the casing 3 in parallel with a surface of the circuit board 25.

The casing 3 of the examplary apparatus of FIGS. 1A and 1B also comprises at least one insulating layer 7. The insulating layer 7 may comprise any means which insulates the contact pads 11 and connecting wire 13 from the metal layer 9. The insulating layer 7 may comprise any suitable insulating material. The insulating layer 7 may be mounted on the inside of the casing 3 so that the insulating layer 7 is within the cavity 15.

In the examplary embodiment illustrated in FIGS. 1A and 1B the apparatus 1 comprises two insulating layers 7 mounted on opposing sides of the inside of the cavity 15. The first insulating layer 7 may be mounted on the bottom surface of the cavity 15 and the second insulating layer 7 may be mounted on the upper surface of the cavity 15.

In the examplary embodiments illustrated in FIGS. 1A and 1B the apparatus 1 also comprises a first set of contact pads 11 and a second set of contact pads 11. The contact pads 11 may comprise any means which may be configured to enable an electrical connection to be established between the contact pads 11 and at least one memory card 19 when the memory card 19 is inserted within the casing 3. The contact pads 11 may enable information to be read from the memory card 19 and used by a device such as a communications device.

A connecting wire 13 may be provided to connect the contact pads 11 to the circuit board 25 and the rest of the device. In the cross sectional view of the examplary embodiment illustrated in FIGS. 1A and 1B the connecting wire 13 extends into the page so that the connecting wire extends out of the back of the apparatus 13 to the circuit board 25.

In the examplary illustrated embodiments the contact pads 11 may be mounted on the insulating layers 7 to protect the contact pads 11 from the metal layer 5 of the casing 3.

The two sets of contact pads 11 may be provided on opposing sides of the inside of the cavity 15. The first set of contact pads 11 may be mounted on the bottom surface of the cavity 15 and the second set of contact pads 11 may be mounted on the upper surface of the cavity 15. It is to be appreciated that in other embodiments of the disclosure other arrangements of the contact pads 11 may be used.

FIG. 1B illustrates the same apparatus of FIG. 1A and so the same reference numbers are used to refer to the same features. However. In FIG. 1B a plurality of memory cards 19 have been inserted into the casing 3 and the apparatus 1 has been mounted on a circuit board 25.

In FIG. 1B the memory cards 19 are held in a memory card holder 17 and both the memory card holder 17 and the plurality of memory cards 19 have been inserted within the casing 3 of the apparatus 1.

The plurality of memory cards 19 may comprise any suitable type of memory cards. The memory cards may comprise any cards which may be configured to store information. For example the plurality of memory cards may comprise one or more SIM cards which may comprise identification information or other information which may enable a user to communicate within a communications network. As another example, in some embodiments of the disclosure the plurality of memory cards 19 may comprise one or more smart cards which may store information which may enable transactions such as financial transactions to be authorized.

The plurality of memory cards 19 inserted within the apparatus 1 in FIG. 1B may comprise different types of memory cards. In some embodiments of the disclosure the plurality of memory cards 19 may have the same sizes and/or shapes. In other examplary embodiments of the disclosure the plurality of memory cards 19 may have different sizes and/or shapes.

In FIG. 1B two memory cards 19 are inserted within the apparatus 1. In other embodiments of the disclosure more than two memory cards 19 may be inserted in the apparatus 1.

In the examplary embodiment of FIGS. 1A and 1B the plurality of memory cards 19 are held within a memory card holder 17. The memory card holder 17 may comprise any means which may be configured to securely hold the plurality of memory cards 19 and enable them to be removably inserted into the casing 3 of the apparatus 1. In FIG. 1B the memory card holder 17 is configured to hold two memory cards 19. In other embodiments of the disclosure the memory card holder 17 may be configured to hold more than two memory cards 19.

In the examplary embodiment of FIG. 1B the memory card holder 17 comprises a substrate 21. The substrate 21 comprises a flat portion which may be configured to support the plurality of memory cards 19. In the embodiment of FIG. 1B the substrate is configured to support a first memory card 19 on an upper surface of the substrate 21 and a second memory card 19 on a lower surface of the substrate 21.

When the two memory cards 19 are held in the memory card holder 17 the memory cards may face in opposing directions. This may enable the two memory cards 19 to establish electrical connections with the two sets of contact pads 11. In some embodiments of the disclosure the apparatus 1 and the memory card holder 17 may be configured so that both of the memory cards 19 may establish electrical connections with a set of contact pads simultaneously.

The memory card holder 17 may be configured to hold the plurality of memory cards 19 in a stacked configuration. When the memory cards 19 are in a stacked configuration the memory cards 19 may be positioned in layers overlaying each other. The substrate 21 of the memory card holder 17 may be provided between the plurality of memory cards 19.

In the examplary embodiment of FIG. 1B the memory card holder 17 may also comprise a plurality of grips 23. The grips 23 may comprise any means which may be configured to secure the plurality of memory cards 19 to the memory card holder 17. The grips may be configured to be biased towards to the substrate 21 so that when a portion of a memory card 19 is positioned between the grip 23 and the substrate 21 the grip 23 pushes the memory card 19 toward the substrate 21.

The plurality of memory cards 19 and the memory card holder 17 may be configured to be removably inserted within the casing 3. The casing 3 may be configured so that the plurality of memory cards 19 may fit entirely within the casing 9. The casing 3 may be configured so that the plurality of memory cards 19 may fit entirely within the casing 9 so that every part of the plurality of memory cards 19 is contained within the cavity 15.

The apparatus 1 and memory card holder 17 may be configured to enable a user to push the plurality of memory cards 19 and the memory card holder 17 into the casing 3. The apparatus 1 and memory card holder 17 may also be configured to enable a user to remove the plurality of memory cards 19 and the memory card holder from the casing 3. In some embodiments of the disclosure the apparatus 1 and memory card holder 17 may be configured to enable a user pull the plurality of memory cards 19 and the memory card holder 17 out of the casing 3. In some embodiments the apparatus 1 and memory card holder 17 may be configured to enable a user to actuate a mechanism which may cause the plurality of memory cards 19 and the memory card holder 17 to be pushed or pulled out of the casing 3.

The memory card holder 17 may be configured to fit tightly into the casing 3 of the apparatus 1. The memory card holder 17 may fit tightly within the cavity 15 so that there is no gap or very little gap between the edges of the memory card holder 17 and the edge of the cavity 15. In the examplary embodiment illustrated in FIG. 1B the memory card holder 17 has a substantially T-shaped cross-section. The shape of the cross-section of the memory card holder 17 corresponds to the shape of the cross-section of the cavity 15 of the casing 3.

In FIG. 1B the apparatus 1 is also illustrated mounted on a circuit board 25. The mounting portions 12 are used to support the apparatus 1 and the securing portions 10 may be used to secure the apparatus 1 to the circuit board 25. As the mounting portions 12 are positioned midway up the side of the casing 3 when the apparatus 1 is mounted on the circuit board a first portion 14 of the apparatus 1 is positioned above the circuit board 25 and a second portion 16 of the apparatus 1 is positioned below the circuit board 25.

Figure 2:
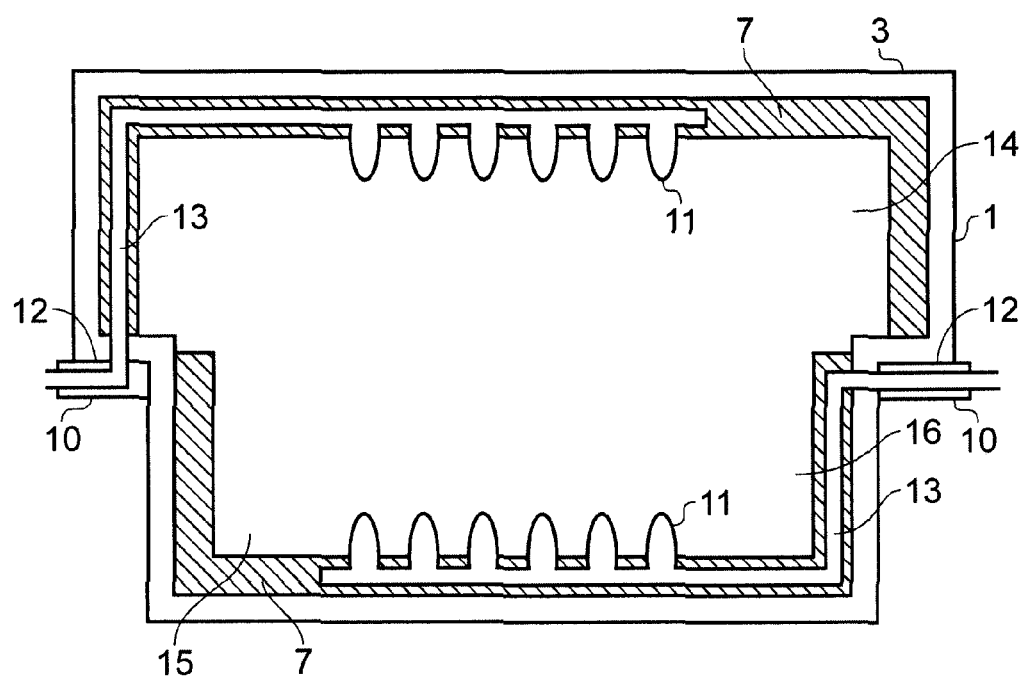
FIG. 2 illustrates an apparatus according to another exemplary embodiment of the disclosure.

FIG. 2 illustrates an apparatus 1 similar to the apparatus 1 illustrated in FIGS. 1A and 1B and described above. The same reference numerals have been used to refer to corresponding features. The examplary apparatus 1 illustrated in FIG. 2 also comprises a casing 3 which comprises a metal layer 5, at least one insulating layer 7, at least one set of contact pads 11 and a mounting portion 12.

The apparatus 1 illustrated in FIG. 2 differs from the apparatus 1 illustrated in FIGS. 1A and 1B in that in the cross sectional view of the examplary embodiment illustrated in FIGS. 1A and 1B the connecting wire 13 extends into the page so that the connecting wire extends out of the back of the apparatus 1. In the examplary embodiment illustrated in FIG. 2 the connecting wire 13 extends to the side of the apparatus 1 and through the securing portion 10 of the mounting portion 12. As the connecting wire 13 extends out of the side of the apparatus the insulating layer 7 covers the sides of the cavity 15 as well as the upper and lower surfaces where the contact pads 11 are located.

Figure 3A:
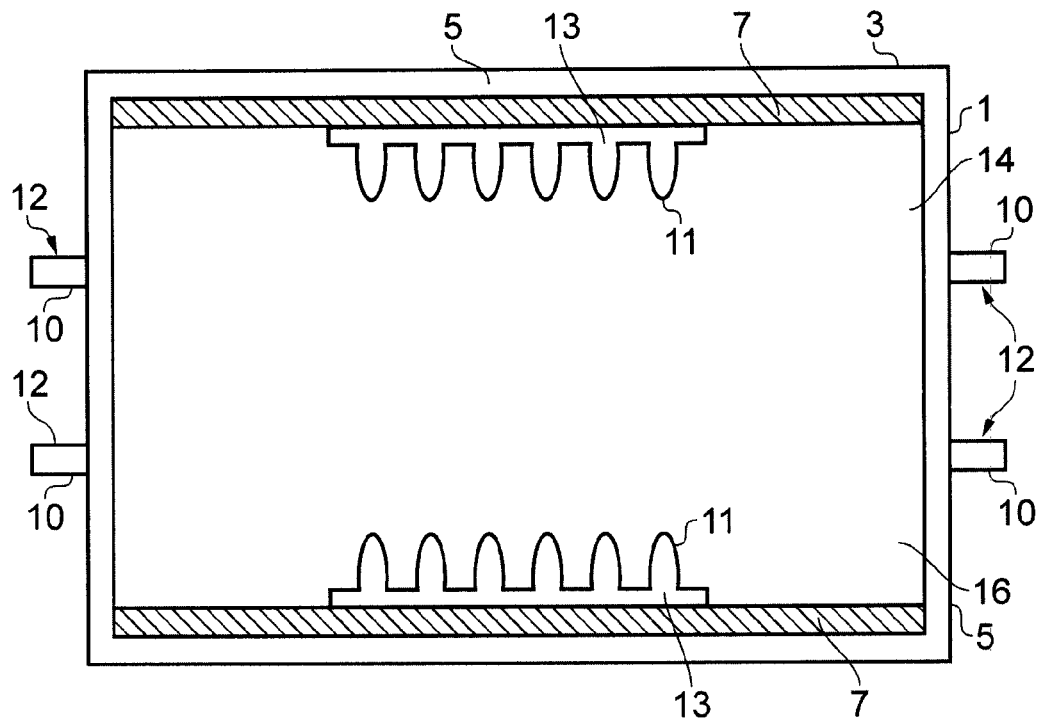
FIGS. 3A and 3B illustrate an apparatus according to a further exemplary embodiment of the disclosure.
Figure 3B:
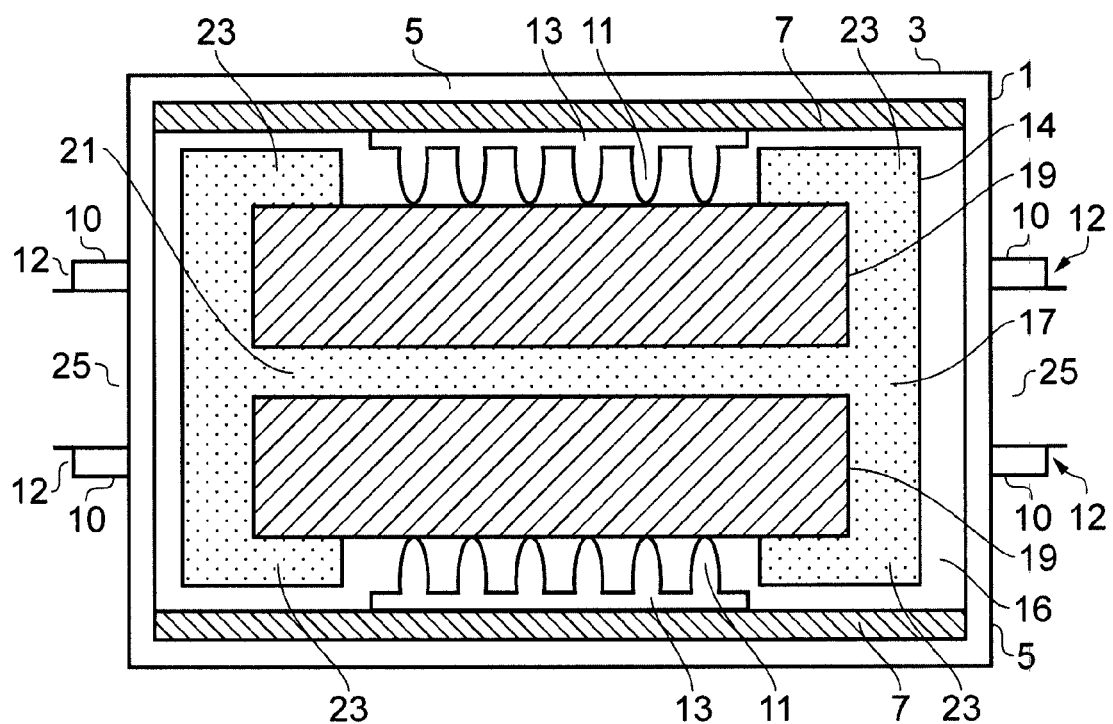

FIGS. 3A and 3B also illustrate a cross sectional view of an apparatus 1 similar to the apparatus 1 illustrated in FIGS. 1A, 1B and FIG. 2 described above. The same reference numerals have been used to refer to corresponding features. The examplary apparatus 1 illustrated in FIGS. 3A and 3B also comprises a casing 3 which comprises a metal layer 5, at least one insulating layer 7, at least one set of contact pads 11 and a mounting portion 12.

The apparatus 1 illustrated in FIGS. 3A and 3B differs from the apparatus 1 illustrated in FIGS. 1A and 1B and FIG. 2 in that it has a different cross sectional shape. The apparatus 1 illustrated in FIGS. 3A and 3B has a substantially rectangular or rectangular cross section. The upper portion 14 and the lower portion 16 of the casing 3 of the apparatus 1 both have approximately the same width as each other. The side edges are both flat or substantially flat such that there is no step change in the level of the edge of the casing 3.

FIG. 3A illustrates the apparatus 1 with no memory cards 19 or memory card holder 17 inserted within. The walls of the casing 3 are of approximately the same thickness so that the cavity 15 also has a rectangular or substantially rectangular cross section.

In the examplary apparatus 1 of FIGS. 3A and 3B the mounting portion 12 comprises securing portions 10. The securing portions 10 form projections out of the side of the casing 3 which may be used to support the apparatus 1 when it is mounted on a circuit board 25. The securing portions 10 enable the apparatus 1 to be fixed to a circuit board 25 such as a printed wiring board. The securing portion 10 may comprises a material which enables the apparatus 1 to be secured to the circuit board 25 for example by welding or soldering or an adhesive. In the examplary embodiment of FIGS. 3A and 3B two securing portions 10 are provided on either side of the casing 3 of the apparatus 1. In other embodiments of the disclosure a different number of securing portions 10 may be provided.

In the examplary apparatus of FIGS. 3A and 3B the securing portions 10 may be provided in a mid-portion of the casing 3.

In FIG. 3B the apparatus 1 is illustrated with a plurality of memory cards 19 and a memory card holder 17 inserted within the casing 3. The memory card holder 17 and the plurality of the memory cards 19 are similar to the memory card holder 17 and the plurality of the memory cards 19 described above in relation to FIG. 1B. However the cross sectional shape of the memory card holder 17 used in the embodiment of FIG. 3B is different to the cross sectional shape of the memory card holder 17 used in the embodiment of FIG. 1B. The memory card holder 17 has a cross sectional shape corresponding to the cross sectional shape of the cavity 15 of the casing 3 so that in the embodiment of the disclosure illustrated in FIG. 3B the memory card holder 17 has a substantially cross sectional shape so that the upper portion and the lower portion are substantially the same width.

In FIG. 3B the apparatus 1 is also illustrated mounted on a circuit board 25. The securing portions 10 are used to support the apparatus 1 and secure the apparatus 1 to the circuit board 25. As the securing portions 10 are positioned midway up the side of the casing 3 when the apparatus 1 is mounted on the circuit board a first portion 14 of the apparatus 1 is positioned above the circuit board 25 and a second portion 16 of the apparatus 1 is positioned below the circuit board 25.

FIGS. 4A to 4C illustrate a side view of an apparatus 1 according to an examplary embodiment of the disclosure. The apparatus 1 and the memory cards 19 and memory card holder 17 may be as illustrated in any of FIGS. 1A to 3B and described above and so the same reference numerals are used for corresponding features in FIGS. 4A to 4C. In FIG. 4A the plurality of memory cards 19 and memory card holder 17 are positioned within the casing 3. In FIG. 4B the plurality of memory cards 19 and memory card holder 17 have been removed from the casing 3. In FIG. 4C the plurality of memory cards 19 and the memory card holder 17 have been removed but some examplary connections between the contact pads 11 and the circuit board 25 are illustrated.

The memory card holder 17 may comprises a substrate 21 and gripping portions 23 as described above in relation to FIG. 1B. However it can be seen from the side view of FIGS. 4A and 4B that the card holder 17 may also comprise a closing portion 31.

The closing portion 31 may be positioned at an end of the memory card holder 17. The closing portion 31 may be configured such that when the memory card holder 17 is inserted within the apparatus 1 the closing portion 31 forms part of the external housing of the electronic device which uses the memory cards 19. The apparatus 1 and circuit board 25 may be contained within the housing. The housing of the electronic device may provide protection for the components of the electronic device such as the apparatus 1 and the circuit board 25. For example, the housing may protect the components of the electronic device from atmospheric conditions such as moisture or temperature variations. The housing may also be configured to protect the components of the device from mechanical shocks.

The closing portion 31 may be used by the user of the apparatus to push the card holder 17 into the apparatus 1 into a closed configuration as illustrated in FIG. 4A. In some embodiments the closing portion 31 may also be used by the user of the apparatus 1 to pull the card holder 17 out of the apparatus 1 into an open configuration as illustrated in FIG. 4B. In other embodiments an ejection mechanism may be used to push or pull the card holder 17 out of the apparatus 1 into the configuration illustrated in FIG. 4B. The ejection mechanism may be configured to be actuated by the user. Closing portion 31 may also form part of an outer casing of a device (not shown) when the card holder 17 is inserted fully into the apparatus 1.

In FIG. 4C the connecting wires 13 are illustrated. In the examplary embodiment illustrated in FIG. 4C the connecting wires 13 extend out of the back of the apparatus 1. In some embodiments the arrangement of the connecting wires in FIG. 4C may be similar to the arrangement of the connecting wires of the embodiments illustrated in FIGS. 1A and 1B.

In FIG. 4C the connecting wires 13 from both sets of contact pads 11 may be coupled to the same side of the circuit board 25. The connecting wires 13 from both sets of contact pads 11 may be coupled to the upper side of the circuit board 25. This arrangement of the connecting wires 13 may make it easier for the contact pads 11 to be coupled to circuits on the circuit board 25.

FIGS. 5A and 5B illustrate a side view of an apparatus according to another examplary embodiment of the disclosure. The apparatus 1 and the memory cards 19 and memory card holder 17 may be as illustrated in any of FIGS. 1A to 4B and described above and so the same reference numerals are used for corresponding features in FIGS. 5A and 5B. FIG. 5A illustrates the memory card holder 17 and the apparatus 1 in a configuration where one memory card 19 is inserted in the apparatus 1 and one memory card is outside of the apparatus 1. FIG. 5B illustrates the memory card holder 17 and the apparatus 1 in a configuration where both the memory cards 19 are inserted in the apparatus 1

The memory card holder 17 illustrated in FIGS. 5A and 5B also comprises grips 23 and a closing portion 31 as described above in relation to FIG. 1B and FIGS. 4A and 4B.

However the memory card holder 17 illustrated in FIGS. 5A and 5B comprises two substrates 21A and 21B.

In the examplary embodiments of FIGS. 5A and 5B the memory card holder 17 comprises two substrates 21A, 21B. The two substrates 21A, 21B are arranged parallel to each other so that a first substrate 21A supports a first memory card and a second substrate 21B supports a second memory card 19. The two substrates 21A, 21B may also be arranged overlaying each other so that the memory cards 19 may be configured in a stacked configuration. The two substrates 21A, 21B may be arranged so that the two memory cards 19 face in opposite directions when they are held in the memory card holder 17.

The substrates 21A, 21B are configured to move relative to each other. In the particular embodiment of FIGS. 5A and 5B the two substrates 21A and 21B may be slid relative to each other. The direction of the sliding may be in a plane parallel to the plane of the substrates 21A, 21B.

The two substrates may be slid into a configuration so that the two substrates 21A, 21B overlay each other. When the memory card holder 17 is in this configuration the whole of the memory card holder 17 and any memory cards 19 held in the memory card holder may be inserted within the cavity 15 of the casing 3. When the memory card holder 17 is in this configuration the two memory cards 19 may also overlay each other.

The memory card holder 17 may be configured to enable a user to remove the first substrate 21A of the memory card holder 17 from the casing 3 by applying a force to the first substrate. For example the user may pull the closing portion 31 or may actuate an ejection mechanism which may then cause a force to be applied to the first substrate 21A. The memory card holder 17 may be configured so that the force causes the first substrate 21A to move relative to the second substrate 21B. This may cause the first substrate 21A and any memory card 19 supported by the first substrate to be removed from the casing 3 while the second substrate 21B and any memory card 19 supported by the second substrate 21B remain within the casing 3 as illustrated in FIG. 5A.

Once the first substrate 21A has been moved so that the edge of the first substrate 21B is close to edge of the second substrate 21B, as illustrated in FIG. 5B then the first substrate 21A may couple to the second substrate 21B. The coupling may be such that if the user pulls the cover portion 31 this pulls the first substrate 21A and also the second substrate 21B. This allows the second substrate 21B and any memory card 19 mounted within the second substrate to be removed from the apparatus 1 as illustrated in FIG. 5B.

The memory card holder 17 described above provides a benefit that a user can remove a single memory card 19 at a time. This may enable a user to remove one memory card 19 while another memory card 19 may remain in electrical connection with the apparatus 1. This may also enable the memory cards 19 to be changed one at a time which may reduce the likelihood of a user dropping a memory card or losing a memory card or mixing memory cards 19 up.

Figure 6A:
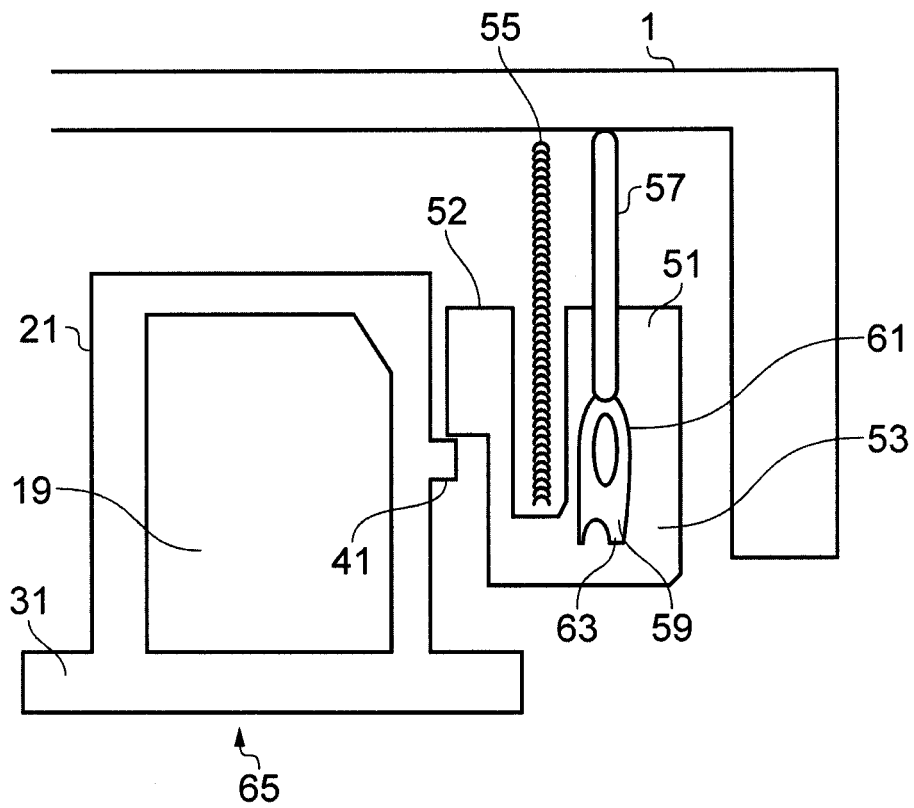
FIGS. 6A and 6B illustrate an ejection mechanism according to an embodiment of the disclosure.
Figure 6B:
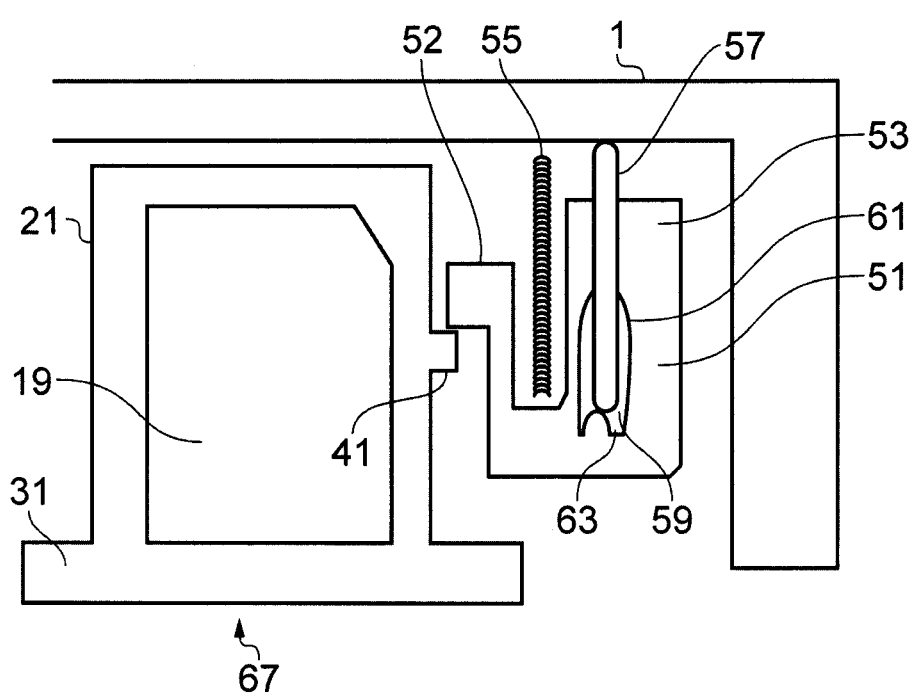

FIGS. 6A and 6B illustrate an apparatus 1 according to another embodiment of the disclosure. The same reference numerals used in FIGS. 1A to 5B are used for corresponding features. As with the embodiments illustrated in FIGS. 1A to 5B and described above the apparatus 1 comprises a casing 3. A card holder 17 and a plurality of memory cards 19 may be received within the casing 3. FIGS. 6A and 6B are plan views of an examplary apparatus 1. The top of the casing 3 is not illustrated for clarity.

The memory card holder 17 comprises a closing portion 31 and a substrate 21. The closing portion 31 and the substrate 21 may be as described above. The plurality of memory cards 19 may be supported by the substrate 21.

In FIG. 6A the memory card holder 17 is illustrated in an open position in which the plurality of memory cards 19 are not entirely contained within the apparatus 1. In the configuration illustrated in FIG. 6A the closing portion 31 of the memory card holder 17 is not aligned with the edge of the casing 3.

In FIG. 6B the memory card holder 17 is illustrated in a closed position in which the plurality of memory cards 19 are entirely contained within the apparatus 1. When the memory card holder 17 is in a closed position an electrical connection may be established between the plurality of memory cards 19 and the apparatus 1. When the memory card holder is in the closed position the closing portion 31 of the memory card holder 17 may be aligned with the edge of the casing 3.

In the examplary embodiments of FIGS. 6A and 6B the memory card holder 17 comprises a projection 41. The projection 41 may be positioned on a side of the substrate 21 of the memory card holder 17. In the examplary embodiment of FIGS. 6A and 6B the projection 41 is positioned midway along the side of the substrate 21. In other embodiments of the disclosure the projection 41 may be positioned in a different location.

The projection 41 provides means for coupling the memory card holder 17 to an ejection mechanism 51. In some embodiments of the disclosure the projection 41 may be shaped so as to couple to the memory card holder 17 to the ejection mechanism 51. In some embodiments of the disclosure the projection 41 may be fixed to the ejection mechanism 51, for example by a nail or pin or any other suitable fixing means.

The ejection mechanism 51 may comprise any means which may enable the memory card holder 17 to be ejected from the apparatus 1. The ejection mechanism 51 may comprise any means which may enable the memory card holder 17 to be moved between the open position illustrated in FIG. 6A and the closed position illustrated in FIG. 6B. In the particular example of FIGS. 6A and 6B the ejection mechanism 51 comprises a push-push mechanism. However it is to be appreciated that other types of mechanism could be used in other embodiments of the disclosure.

The ejection mechanism 11 of FIGS. 6A and 6B comprises a sliding member 53, a resilient member 55 and a locking member 57.

The sliding member 53 may be configured to slide between an open configuration as illustrated in FIG. 6A and a closed configuration as illustrated in FIG. 6B.

The sliding member 53 of the examplary embodiments of FIGS. 6A and 6B comprises a projection 52. The projection 52 may be configured to abut the projection 41 of the memory card holder 17. This may enable the memory card holder 17 to be coupled to the ejection mechanism 51 so that movement of the sliding portion 53 may cause movement of the memory card holder 17 and movement of the memory card holder 17 may cause movement of the sliding member 53.

The resilient member 55 may be coupled to the casing 3 and the sliding member 53. The resilient member 55 may be configured to bias the sliding member 53 toward the open configuration illustrated in FIG. 6A. In the examplary embodiment of FIG. 6A the resilient member 55 comprises a spring. It is to be appreciated that other types of resilient member 55 may be used in other embodiments of the disclosure.

The locking member 57 may be coupled to the sliding member 53 and the casing 3. The locking member 57 may be configured to fit into a recessed portion 59 of the sliding member 53. The recessed portion 59 may be shaped so as to comprise a first locking position 61 and a second locking position 63. The recessed portion 59 may also shaped to enable the locking member 57 to move between the first locking position 61 and the second locking position 63.

In the examplary embodiment illustrated in FIG. 6A the apparatus 1 is configured so that the memory card holder 17 is positioned in a partially open position. In this configuration the locking member 57 is located in the first locking position 61. This allows the sliding member 53 to be pushed outward by the resilient member 55 towards the open configuration.

In the examplary embodiment illustrated in FIG. 6B the apparatus 1 is configured so that the memory card holder 17 is positioned in a closed position. A user of the device 3 may cause the card holder 17 to be moved from the partially open position illustrated in FIG. 6A to the closed position illustrated in FIG. 6B by applying a force in an inwards direction to the closing portion 31 as indicated by the arrow 65. This compresses the resilient member 55 and forces the locking member 57 along the recessed portion to the second locking position 63.

In the examplary embodiment of FIGS. 6A and 6B a user may release the locking member 57 from the second locking position 63 by applying a force to the closing portion 31 in an inward direction as indicated by arrow 67. Once the locking member 57 has been released the compressed resilient member 55 will cause an outwards force to be applied to the sliding member 53 and push the sliding member 53 and the memory card holder 17 to an open or partially open position so as to return the apparatus 1 to the configuration illustrated in FIG. 6A.

Embodiments of the disclosure provide an apparatus 1 which may be receive a plurality of memory cards 19 simultaneously. This may enable the user of a device to easily switch between the use of the two or more memory cards 19. In some embodiments it may also enable more than one memory card 19 to be used simultaneously.

The mounting portions 12 of the apparatus 1 may be configured so that the apparatus 1 may be positioned having a first portion 14 located above a circuit board 25 and a second portion 16 located below a circuit board 25. This may enable the overall thickness of the circuit board 25 and the apparatus 1 to be minimised. This may enable a thinner device to be provided.

As the apparatus 1 is provided with the contact pads 11 on opposing sides of the casing 3 this enables the two sets of contact pads 11 to be accessed simultaneously. This may enable two memory cards 19 positioned within the apparatus 1 to establish an electrical connection with the contact pads 11 at the same time. This may enable a user of the device to switch between the two memory cards 19 without having to take either of the memory cards 19 out or make any manual change of the position of the memory cards 19.

In the embodiments described above the term "coupled" means operationally coupled and any number or combination of intervening elements may exist between coupled components (including no intervening elements).

Although embodiments of the present disclosure have been described in the preceding paragraphs with reference to various examples, it should be appreciated that modifications to the examples given can be made without departing from the scope of the disclosure as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the disclosure believed to be of particular importance it should be understood that the Applicant claims protection in respect of any patentable feature or combination of features hereinbefore referred to and/or shown in the drawings whether or not particular emphasis has been placed thereon.

The invention claimed is:

1. An apparatus comprising:
a casing configured to enable a plurality of memory cards to be removably inserted into the casing;
contact pads located within the casing configured to enable an electrical connection to be established between the contact pads and at least one memory card when the plurality of memory cards are inserted within the casing;
at least one mounting portion supporting the apparatus to be mounted on a circuit board such that a first portion of the apparatus is positioned above the circuit board and a second portion of the apparatus is positioned below the circuit board wherein the mounting portion is provided on an outer side of the casing;
wherein the casing is configured to receive a memory card holder wherein the memory card holder is configured to hold the plurality of memory cards; and
wherein the memory card holder forms part of the outer casing of a device when the memory card holder is inserted fully into the apparatus.

2. The apparatus as claimed in claim 1 wherein the casing is configured so as to receive the plurality of memory cards in a stacked configuration.

3. The apparatus as claimed in claim 1 wherein the contact pads comprise a first set of contact pads and a second set of contact pads wherein the first set of contact pads is configured to enable an electrical connection to be established between the first set of contact pads and a first memory card and the second set of contact pads is configured to enable an electrical connection to be established between the second set of contact pads and a second memory card.

4. The apparatus as claimed in claim 1 wherein the first set of contact pads are located on an opposing side of the casing to the second set of contact pads.

5. The apparatus as claimed in claim 1 wherein the apparatus comprises a spring mechanism configured to enable the memory cards to be ejected from the casing.

6. The apparatus as claimed in claim 1 wherein the casing comprises a metal layer.

7. The apparatus as claimed in claim 1 wherein the casing comprises an insulating layer.

8. The apparatus as claimed in claim 7 wherein the contact pads are mounted on the insulating layer.

9. The apparatus as claimed in claim 1, wherein the plurality of memory cards have at least one of different sizes and different shapes.

10. The apparatus as claimed in claim 1, wherein the memory card holder is configured to hold the plurality of memory cards in a stacked configuration.

11. The apparatus as claimed in claim 1 wherein the at least one mounting portion comprises a support.

12. The apparatus as claimed in claim 11 wherein an upper portion of the casing has a larger width than a lower portion of the casing to form the support.

13. A memory card holder comprising at least one flat substrate configured to hold a plurality of memory cards wherein the memory card holder is configured to be removably inserted into the casing of an apparatus wherein the apparatus comprises a casing configured to enable a plurality of memory cards to be removably inserted into the casing;
   contact pads located within the casing configured to enable an electrical connection to be established between the contact pads and at least one memory card when the plurality of memory cards are inserted within the casing; and
   at least one mounting portion configured to enable the apparatus to be mounted on a circuit board such that a first portion of the apparatus is positioned above the circuit board and a second portion of the apparatus is positioned below the circuit board wherein the mounting portion is provided on an outer side of the casing;
   wherein the casing is configured to receive a memory card holder wherein the memory card holder is configured to hold the plurality of memory cards; and
   wherein the memory card holder forms part of the outer casing of a device when the memory card holder is inserted fully into the apparatus.

14. The memory card holder as claimed in claim wherein the memory card holder is configured to hold the plurality of memory cards in a stacked configuration.

15. The memory card holder as claimed in claim 13 wherein the at least one substrate is configured to hold a first memory card and a second memory card such that contact points of the first and second memory cards face towards opposite directions.

16. The memory card holder as claimed in claim 13 comprising a first substrate and a second substrate wherein the first substrate is configured to hold a first memory card and the second substrate is configured to hold a second memory card and the first and second substrates are configured to be moved with respect to each other.

17. The memory card holder as claimed in claim 16 wherein the first and second substrates may be slid relative to each other in a direction parallel with a plane of the substrates.

18. The memory card reader comprising:
   an apparatus comprising:
      a casing configured to enable a plurality -of memory cards to be removably inserted into the casing;
      contact pads located within the casing configured to enable an electrical connection to be established between the contact pads and at least one memory card when the plurality of memory cards are inserted within the casing; and
      at least one mounting portion configured to enable the apparatus to be mounted on a circuit board such that a first portion of the apparatus is positioned above the circuit board and a second portion of the apparatus is positioned below the circuit board wherein the mounting portion is provided on an outer side of the casing; and
   a memory card holder as claimed in claim 13.

19. A memory card holder configured to hold a plurality of memory cards comprising a first substrate and a second substrate wherein the first substrate is configured to hold a first memory card and the second substrate is configured to hold a second memory card and the first and second substrates are configured to be moved with respect to each other in a direction parallel with a plane of the substrates, wherein the memory card holder is configured to be removably inserted into a casing of an apparatus.

20. The memory card holder as claimed in claim 19 wherein the memory card holder is configured to hold the plurality of memory cards in a stacked configuration.

21. An apparatus comprising:
   a casing configured to enable a plurality of memory cards to be removably inserted into the casing;
   contact pads located within the casing configured to enable an electrical connection to be established between the contact pads and at least one memory card when the plurality of memory cards are inserted within the casing;
   at least one mounting portion configured to enable the apparatus to be mounted on a circuit board such that a first portion of the apparatus is positioned above the circuit board and a second portion of the apparatus is positioned below the circuit board wherein the mounting portion is provided on an outer side of the casing;
   wherein the casing is configured to receive a memory card holder wherein the memory card holder is configured to hold the plurality of memory cards; and
   wherein the memory card holder forms part of the outer casing of a device when the memory card holder is inserted fully into the apparatus.

22. An apparatus comprising:
   a casing configured to enable a plurality of memory cards to be removably inserted into the casing;
   contact pads located within the casing configured to enable an electrical connection to be established between the contact pads and at least one memory card when the plurality of memory cards are inserted within the casing;
   at least one mounting portion means for enabling the apparatus to be mounted on a circuit board such that a first portion of the apparatus is positioned above the circuit board and a second portion of the apparatus is positioned below the circuit board wherein the mounting portion is provided on an outer side of the casing;
   wherein the casing is configured to receive a memory card holder wherein the memory card holder is configured to hold the plurality of memory cards; and
   wherein the memory card holder forms part of the outer casing of a device when the memory card holder is inserted fully into the apparatus.

\* \* \* \* \*

UNITED STATES PATENT AND TRADEMARK OFFICE
CERTIFICATE OF CORRECTION

| | | |
|---|---|---|
| PATENT NO. | : 9,578,778 B2 | Page 1 of 1 |
| APPLICATION NO. | : 14/394810 | |
| DATED | : February 21, 2017 | |
| INVENTOR(S) | : Bocheng Hou et al. | |

It is certified that error appears in the above-identified patent and that said Letters Patent is hereby corrected as shown below:

On the Title Page

Assignee:
"Nokia Corporation" should be deleted and -- Nokia Technologies Oy -- should be inserted.

Signed and Sealed this
First Day of August, 2017

Joseph Matal
*Performing the Functions and Duties of the*
*Under Secretary of Commerce for Intellectual Property and*
*Director of the United States Patent and Trademark Office*